(12) United States Patent
Nishino et al.

(10) Patent No.: US 6,790,793 B2
(45) Date of Patent: Sep. 14, 2004

(54) METHOD FOR MANUFACTURING SEMICONDUCTOR DEVICE

(75) Inventors: Yutaka Nishino, Nakano-ku (JP);
Kenichi Suzaki, Nakano-ku (JP);
Norikazu Mizuno, Nakano-ku (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/375,130

(22) Filed: Feb. 28, 2003

(65) Prior Publication Data

US 2003/0224615 A1 Dec. 4, 2003

(30) Foreign Application Priority Data

Mar. 26, 2002 (JP) ....................................... 2002-084964
Jan. 24, 2003 (JP) ....................................... 2003-015923

(51) Int. Cl.[7] ........................ H01L 21/31; H01L 21/469
(52) U.S. Cl. ........................ 438/791; 438/758; 438/787
(58) Field of Search ................................ 438/758, 787, 438/791

(56) References Cited

U.S. PATENT DOCUMENTS 6,323,139 B1 * 11/2001 Moore et al. ............... 438/786
6,468,903 B2 * 10/2002 Bolscher et al. ............ 438/680
2003/0180556 A1 * 9/2003 Lynn ........................ 428/472.2

* cited by examiner

Primary Examiner—Alexander Ghyka
(74) Attorney, Agent, or Firm—Oliff & Berridge, PLC (57) ABSTRACT

In a method for manufacturing a semiconductor device, the following three steps (oxide film forming step, cycle purge step, and coating step) are performed sequentially before performing substrates processing with a semiconductor device manufacturing apparatus. In the oxide film forming step, an oxide film 28 is grown on the surfaces of a flange portion 27 and a cap portion 30 which compose metal parts of a furnace port by baking the furnace port 40 so that corrosion resistance is improved. In the cycle purge step, residual moisture on the part of a gas supply system 35 and inside the piping is removed to suppress a chemical reaction between DCS gas which increases corrosiveness by reaction with moisture, and the metal parts 41 of the furnace port. In the coating step, the DCS gas is continuously supplied to the gas supply system 35, and a $SiO_2$ film is coated on the surface of the flange portion 27 and the cap portion 30, and at the same time a residue containing metal such as Fe and the like which remains in the inside of the supply system 35 is changed into chloride or the like which is high in vapor pressure so that the chloride is discharged.

15 Claims, 4 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device in which the semiconductor devices are processed in a state of charging a plurality of substrates on a boat.

2. Description of the Related Art

When a reactive gas, such as $SiH_2Cl_2$ (DCS: dichlorosilane) and NH3 gas, for instance, is supplied into a brand-new semiconductor device manufacturing apparatus which has been just delivered to a user to form a $Si_3N_4$ film on a wafer, a detected amount of Fe contamination on the wafer comes to 10 to 30 times of the permissible value ($10 \times 10^{10}$ atoms/cm$^2$). This is due to initial metal contamination. The source of the initial metal contamination is due to a residue containing Fe, which comes from corrosion on the surface of metal parts of a furnace port of the apparatus or remains in a supply system. Yield of the semiconductor device which is produced with a wafer exposed to a contamination amount over the permissible value comes to remarkably low. Therefore, it is necessary to suppress the amount of contamination below the permissible value. It has been known from practical experience that repeated deposition decreases the initial metal contamination gradually. Accordingly, a method of repeating the deposition 30 to 40 times until the amount of the metal contamination reaches equal to or less than the permissible value has been adopted generally in order to decrease the initial metal contamination.

However, the above-described method to repeat the deposition requires to continue the deposition repeatedly for three to four weeks from start of the method till the amount of metal contamination reaches equal to or below the permissible value. Thus, it is difficult to decrease the metal contamination in a short time, and the semiconductor device manufacturing apparatus cannot be used during that time for manufacturing semiconductor device. Therefore, various methods to decrease the metal contamination at the furnace port have been proposed.

In a patent document 1, in order to prevent generation of metal impurities by the surface of metal parts (manifold) being exposed to $NH_3$ in a heat treatment apparatus using $NH_3$, a method to form an oxide film on the surface of metal parts is proposed. In order to form the oxide film, $O_2$ is supplied from an $O_2$ gas supply port and the heat treatment is carried out in an $O_2$ gas atmosphere.

In a patent document 2, a method is disclosed in that a passivation treatment (forming of a chromium oxide film) is applied to a metal substance (SUS flange) in a CVD apparatus so that the metal substance changes to be inactive to a corrosive gas and a reducing gas, and a coating film is formed further thereon to prevent the metal contamination. In order to form a chromium oxide film, the surface of the metal parts made of SUS is smoothed by electropolishing and the like and then the SUS part is washed with heated deionized water. The film deposited on the chromium oxide film is a CVD film. As the sort of film (raw materials), a Poly-Si film ($SiH_4/N_2$), a $Si_3N_4$ film ($DCS/NH_3/N_2$), a SiC film ($SiH_4/CH_4/N_2$), and a $SiO_2$ film ($TEOS/N_2$) can be used. The thickness of the coating film is about 100 nm.

In a patent document 3, a method of coating metal parts with a chromic oxide film to suppress corrosion and metal contamination on the metal parts in an oxidation apparatus and a CVD apparatus is disclosed. In order to apply coating, a slurry is coated on a metal surface, then a porous film is formed by heating, which is impregnated with an aqueous solution of chromium acid anhydride while being heated. This combination of impregnation of chromium acid and heat treatment is repeated. Incidentally, there is also a description that a cycle purge is carried out after a wafer is loaded and before it is treated. The timing of the cycle purge is after the wafer loading and before the wafer treatment.

In a patent document 4, a method is disclosed in that in a CVD apparatus depositing a SiN film, the inside of a reaction tube is coated with the same film as the film to be deposited in order to prevent contamination by impurities of heavy metals and the like generated from a reaction tube, not from metal members. When coating, a reactive gas is supplied in an amount equal to or more than the amount supplied during the deposition. The thickness of the coating film is equal to or more than 0.8 $\mu$m, or equal to or more than 1 $\mu$m.

In a patent document 5, in a CVD apparatus, a method of covering at least exposed portions of a flange portion and a lid body (metal members) in the inside of a reaction tube with an adherent layer (ceramics, quartz glass, SiC, and so on) of non-metal material is disclosed. The kinds of film (raw materials) deposited by the CVD apparatus is $SiO_2$ ($SiH_4/O_2$), and $Si(DCS/H_2)$.

The patent document 1: Japanese Patent Laid-open No. Hei 11-26441

The patent document 2: Japanese Patent Laid-open No. Hei 11-345772

The patent document 3: Japanese Patent Laid-open No. 2002-222807

The patent document 4: Japanese Patent Laid-open No. Hei 9-246256

The patent document 5: Japanese Patent Laid-open No. Hei 2-174225

However, in all of the inventions in the above-described patent documents 1 to 5, since the methods of decreasing the metal contamination are complicated and not enough in lowering a metal contamination level, there is room for improvement. That is, there are the following disadvantages respectively in (1) the method of decreasing the metal contamination by growing an oxide film as described in the patent document 1 and 2, (2) the method of decreasing the metal contamination by cycle purge as described in the patent document 2, and (3) the method of decreasing the metal contamination by coating as described in the patent document 2 to 5.

(1) In the method of decreasing the metal contamination by growing an oxide film, the invention described in the patent document 1 requires a new $O_2$ gas supply port, which makes the structure complicated, and the invention described in the patent document 2 requires polishing and washing of the SUS parts, which makes the steps complicated.

(2) In the method of decreasing the metal contamination by cycle purge, in the invention described in the patent document 3, the cycle purge is performed after the wafer load and before the wafer processing (deposition), which takes too much time till the deposition starts.

(3) In the method of reducing the metal contamination by coating, the invention described in the patent document 2 required the coating on the chromium oxide film. The coating film has a similar composition to the kind of film deposited in the CVD process, but not the same composition, which makes the steps complicated. Further, in the invention described in the patent document 3, the coating film is a chromium oxide film and in order to form the chromium oxide film, slurry is applied and heated, and then, an aqueous solution of chromium acid anhydride is impregnated and heat-treated. Repetition of the chromium impregnation and the heat-treatment is required, which makes the steps complicated. In the invention described in the patent document 4, the same film as the deposited film is applied on the inside surface of the reaction tube by coating, but since the number of the coating is only one time, reduction of the metal contamination is not enough. Furthermore, since a reactive gas in an amount equal to or more than that at the time of deposition is supplied to perform the coating without loading wafers in the inside of the reaction tube, the film more than required is formed in the inside of the reaction tube, which causes fears of generating particles due to peeling-off of the film. Further, the invention described in the patent document 5 requires to coat with a non-metal film different from the kind of film used for deposition, which makes the steps complicated.

SUMMARY OF THE INVENTION

An object of the present invention is to provide a method for manufacturing a semiconductor device, which solves problems in the related art described above, and is capable of reducing a metal contamination level sufficiently in spite of its simple structure.

A first invention relates to a method for manufacturing a semiconductor device to perform processing of substrates charged on a boat into a reaction furnace comprising a reaction tube, a heater to heat the inside of the reaction tube, and a furnace port located below the heater and including the metal parts which support the reaction tube, and the method for manufacturing the semiconductor device comprising the step of: coating the surface of the metal parts of the furnace port of the reaction furnace with a film, by supplying the same gas to be used for substrate processing into the reaction furnace, before substrate processing, wherein the coating step is performed a plurality of times. With increase of the number of times in the repeat of the coating process, the metal contamination level is lowered. Further, since the same gas as that used for substrate processing is allowed to pass in the reaction furnace, a gas supply system for coating and a gas supply system for substrate processing can be commonly used.

A second invention is characterized in that in the method for manufacturing the semiconductor device in the first invention, a silicon nitride film is formed on the substrates by a CVD method using $SiH_2Cl_2$ and $NH_3$ in the substrate processing step; and wherein at least $SiH_2Cl_2$ is supplied into the reaction furnace in the coating step. When the SiN film is formed using $SiH_2Cl_2$ and $NH_3$, metal contamination is especially a matter of concern, and can be improved by the invention.

A third invention is characterized in that in the second invention, the film used to coat the surface of the metal parts is a $SiO_2$ film. Deposition of $SiO_2$ on the surface of the metal parts is more effective for the reduction of metal contamination than merely oxidizing the surface of the metal parts to grow the oxide film on the surface of the metal parts.

A fourth invention is characterized in that in the third invention, the $SiO_2$ film is formed by reaction of oxygen containing substance such as $H_2O$ coming into the furnace with $SiH_2Cl_2$ supplied to the reaction furnace. An oxygen containing gas support system to form the $SiO_2$ film becomes unnecessary.

A fifth invention is characterized in that in the first invention, the coating steps comprises the steps of: loading substrates charged on the boat which will not be final products, into the reaction furnace; supplying gas used for the substrate processing into the reaction furnace while heating the substrates charged on the boat in the reaction furnace; and unloading the substrates charged on the boat from the reaction furnace. Since the coating step is carried out when the substrates are charged on the boat, it is possible to prevent formation of a film thicker than required on quartz parts of the reaction tube and the like.

A sixth invention is characterized in that in the first invention, the amount of gas supplied in the coating step is calculated to be greater than the amount of gas supplied in the substrate processing step, which allows the film to be quickly deposited on the surface of the metal parts. Further, it is possible to discharge residual components remaining inside the gas supply system.

A seventh invention is characterized in that in the first invention, the time to keep supplying the gas in the coating step is made longer than the time to keep supplying the gas in the substrate processing step. When the time to supply the gas is made longer, a film of required thickness can be deposited on the surface of the metal parts. Further, it is possible to change metal contaminants in the reaction furnace into chlorides so as to discharge them more effectively.

An eighth invention is characterized in that in the first invention, every time the coating step is repeated, the substrates are replaced by new substrates which will not be final products. Every time the coating step is repeated, the substrates are replaced by new substrates, which prevents the film from peeling off of the substrate.

A ninth invention relates to a method for manufacturing a semiconductor device to deposit a silicon nitride film on substrates charged on a boat by supplying $SiH_2Cl_2$ and $NH_3$ as deposition gases into a reaction furnace comprising a reaction tube, a heater to heat the inside of the reaction tube, and a furnace port located below the heater and including the metal parts which support the reaction tube, and the method for manufacturing the semiconductor device comprising the steps of: coating with a $SiO_2$ film on the surface of metal parts of the furnace port of the reaction furnace by supplying at least $SiH_2Cl_2$ which is a deposition gas into the reaction furnace, before deposition so as to react with oxide containing substance coming into the furnace. It is possible to form a $SiO_2$ film easily on the surface of the metal parts, which has much better effect in reduction of metal contamination than an oxide film by letting the $SiH_2Cl_2$ react with the oxygen containing substance.

A tenth invention relates to a method for manufacturing a semiconductor device to perform processing of substrates charged on a boat into the reaction furnace comprising a reaction tube, a heater to heat the inside of the reaction tube, and the furnace port located below the heater and including the metal parts which support the reaction tube, and the method for manufacturing the semiconductor device comprising the steps of: coating the surface of metal parts with a film by supplying gas to be used for substrate processing into the reaction furnace, before the substrate processing; wherein the coating step comprises: loading the substrates charged on the boat, which will not be final products, into the reaction furnace; supplying gas used for the substrate processing into the reaction furnace while heating the substrates charged on the boat in the reaction furnace; and processing the substrates charged on the boat in the reaction furnace, unloading the substrates charged on the boat from the reaction furnace. Since the coating step is performed in a state of charging substrates on the boat, it is possible to prevent formation of a film thicker than required on a quartz part of the reaction tube and the like.

An eleventh invention relates to a method for manufacturing a semiconductor device to perform processing of substrates charged on a boat in the reaction furnace comprising a reaction tube, a heater to heat the inside of the reaction tube, and the furnace port located below the heater and including the metal parts which support the reaction tube, and the method for manufacturing the semiconductor device comprises the step of: growing an oxide film on the surface of metal parts of a furnace port before the substrate processing, wherein the step of growing the oxide film comprises the steps of: loading the substrates charged on the boat, which will not be final products, into the reaction furnace; heating the substrates charged on the boat in the reaction furnace; and unloading the substrates charged on the boat from the reaction furnace under the atmospheric condition. Since the oxide film is grown on the surface of the metal parts of the furnace port before the substrate processing, the surface of the metal parts of the furnace port is covered with the oxide film so that reduction of the amount of metal contamination from the furnace port can be promoted. Further, since the substrate charged on the boat is unloaded from the reaction furnace under the atmospheric condition, it is possible to grow the oxide film on the surface of metal parts of the furnace port due to radiant heat from the heater inside the reaction furnace, radiant heat from heated substrate and oxygen under the atmospheric condition.

A twelfth invention is characterized in that in the eleventh invention, the oxide film growing step is repeated a plurality of times before the substrate processing step. Since the substrates charged on the boat are unloaded from the reaction furnace a plurality of times under the atmospheric condition, it is possible to grow further the oxide film on the surface of the metal parts of the furnace port due to radiant heat from the heater inside the reaction furnace, radiant heat from heated substrate and oxygen under the atmospheric condition.

A thirteenth invention is characterized in that in the eleventh invention, the oxide film growing step is performed while supplying an inert gas from a gas supply system into the reaction furnace. When the oxide film growing step is performed while supplying the inert gas into the reaction furnace from the gas supply system, it is possible to discharge more effectively residual components such as moisture, particles and so on which remain in the inside of the gas supply system.

A fourteenth invention relates to a method for manufacturing a semiconductor device to perform processing of substrates charged on a boat in the reaction furnace comprising a reaction tube, a heater to heat the inside of the reaction tube, and the furnace port located below the heater and including the metal parts which support the reaction tube, and the method for manufacturing the semiconductor device comprises the step of: growing an oxide film on the surface of metal parts of a furnace port before the substrate processing, wherein the step of growing the oxide film comprises the steps of: inserting the boat into the reaction furnace without charging the substrates thereon; maintaining a furnace port cap which supports the boat and blocks an opening of the furnace port (opening of the reaction furnace) to be apart from the opening of the furnace port; and heating the inside of the reaction furnace in a state of keeping the furnace port cap apart from the opening of the furnace port. Since heating the inside of the reaction furnace is performed in a state that the furnace port cap is kept apart from the opening of the furnace port without blocking the opening of the furnace port completely, though the boat is inserted into the reaction furnace without charging substrates on the boat, it is possible to deposit the oxide film on the surface of the cap portion which is metal parts of the furnace port due to direct radiant heat from the heat of the furnace, and oxygen in the atmosphere coming from a gap between the furnace port cap and a furnace port flange. Therefore, reduction of the amount of the metal contamination from the furnace port can be promoted.

A fifteenth invention is characterized in that in the fourteenth invention, the furnace port cap is kept apart from the opening of the furnace port by about 20 mm. When the distance of the alienation is smaller than the distance of about 20 mm, inflow of oxygen in the atmosphere is little, and when it is larger than the distance of about 20 mm, the amount of escape of the radiant heat becomes large. Therefore, the distance of about 20 mm is just well-balanced between the amount of inflow of oxygen and the amount of escape of the radiant heat, so that the oxide film can be grown effectively on the surface of the cap portion which is metal parts of the furnace port.

A sixteenth invention is characterized in that in the fourteenth invention, the oxide film growing step is performed while supplying an inert gas from a gas supply system into the reaction furnace. When the step of growing the oxide film is performed while supplying the inert gas from the supply system into the reaction furnace, it is possible to discharge more effectively residual components such as moisture, particles and so on which remain in the inside of the gas supply system.

A seventeenth invention relates to a method for manufacturing a semiconductor device to perform processing of substrates charged on a boat in a reaction furnace comprising a reaction tube, a heater to heat the inside of the reaction tube, and a furnace port located below the heater and including metal parts which support the reaction tube, the method for manufacturing the semiconductor device comprises the steps of: growing an oxide film on the surface of metal parts of the furnace port before the substrate processing; and coating with a film on the surface of metal parts by supplying gas to be used for the substrate processing, in the reaction furnace, wherein the coating step is performed a plurality of times. Oxidation on the surface of the metal parts before the coating step improves further the preventive effect of the metal contamination.

An eighteenth invention is characterized in that in the seventeenth invention, included is a step of cycle purging the inside of the reaction furnace after the step of growing the oxide film and before the step of coating. When the step of cycle purging the inside of the reaction furnace is included after the step of growing the oxide film and before the step of coating, it is possible to reduce the amount of the metal contamination more quickly. That is, when a residue which includes metals remaining in the inside of the reaction furnace is discharged by the cycle purge, it is possible to coat a film with no residue contained on the oxide film formed by the step of growing the oxide film.

A nineteenth invention is characterized in that in the seventeenth invention, included is a step of cycle purge in the reaction furnace after the step of coating. Even when the step of cycle purge in the reaction furnace after the step of coating is included, it is possible to reduce the amount of the metal contamination quickly.

A twentieth invention relates to a substrate processing apparatus to perform processing of substrates charged on a boat in a reaction furnace comprising a reaction tube, a heater to heat the inside of the reaction tube, and a furnace port located below the heater and including metal parts which support the reaction tube, and the substrate processing apparatus includes a controller to control to repeat a step of coating a plurality of times, in which a film is coated on the surface of metal parts, while supplying gas to be used for substrate processing, into the reaction furnace before the substrate processing. Work of repeating the coating step a plurality of times before the substrate processing can be performed easily with a simple structure of having a control apparatus.

DETAILED DESCRIPTION OF THE PREFERRED EMBODIMENT(S)

Figure 4:
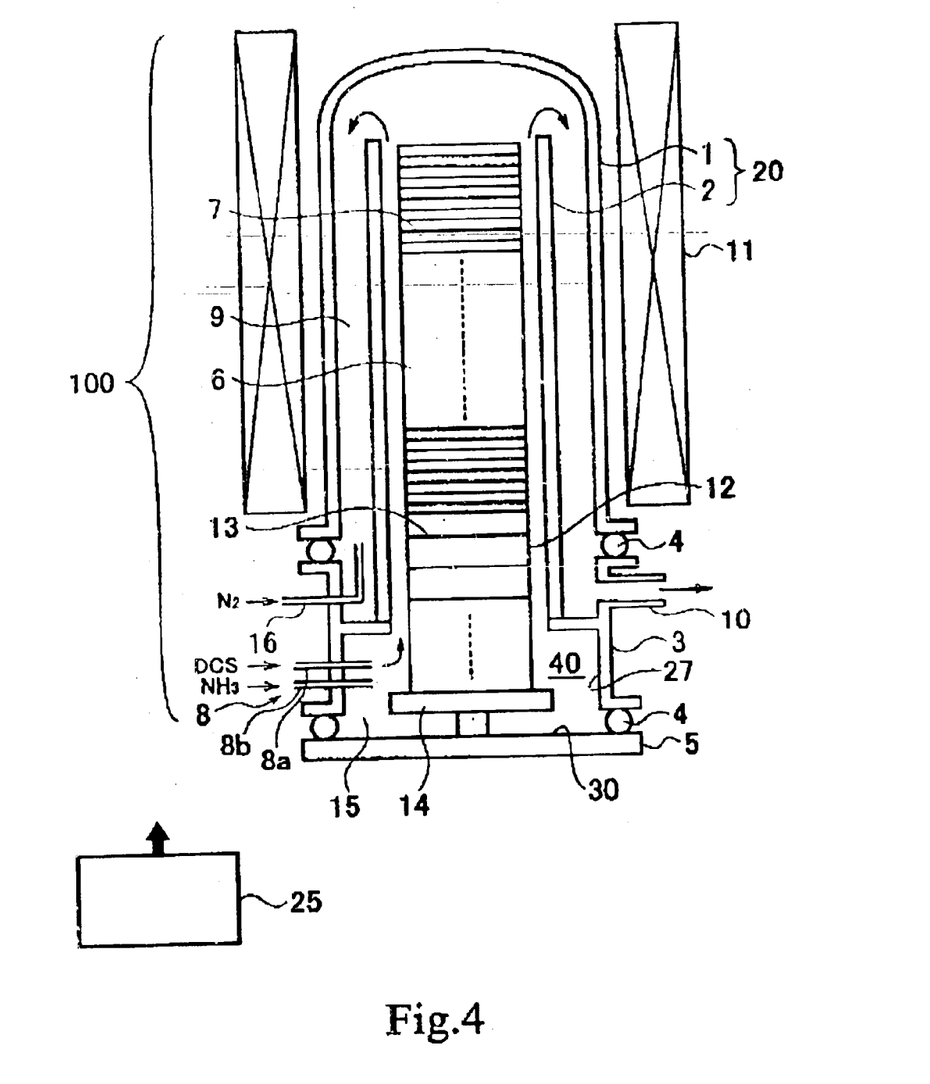
FIG. 4 is a vertical sectional view of a reaction furnace according to the embodiment.

An embodiment of the present invention will be explained below. FIG. 4 shows a schematic structure of a vertical type CVD apparatus to perform a method for manufacturing a semiconductor device.

A quartz reaction tube 20 which performs substrate processing is composed of a double tube consisting of an outer reaction tube 1 and an inner reaction tube 2. The outer reaction tube 1 is provided in the inside of a heater 11. The inner reaction tube 2 which composes a reaction chamber of which upper end is opened is disposed concentrically in the inside of the outer reaction tube 1. The outer reaction tube 1 and the inner reaction tube 2 are arranged below the heater 11 and vertically disposed on a cylindrical metal furnace port flange 3 which supports the reaction tube 20. An O-ring 4 seals a gap between the outer reaction tube 1 and the furnace port flange 3. An opening 15 of a furnace port 15 at the bottom end of the furnace port flange 3 is air-tightly blocked by a metal furnace port cap 5 via the O-ring 4.

A boat 6 is vertically disposed on the furnace cap 5 via a quartz boat cap 12, which is inserted in the inner reaction tube 2. Wafers 7 which will be processed are charged horizontally in many tiers in the boat 6. The boat cap 12 is to perform heat-retaining and heat-insulating of the reaction chamber, and is designed to charge heat insulating boards 13 in many tiers in the inside thereof. Further, a metal cap receiver 14 is rotatably provided on the furnace port cap 5, the boat cap 12 is provided on the cap receiver 14, on which the quartz boat 6 is vertically disposed in a rotatable manner. Incidentally, a rotator to rotate the cap receiver 14 is not shown.

A reactive gas supply system 8 is connected through to the furnace port flange 3 below the inner reaction tube 2. Further, an exhaust system 10 is connected to the furnace port flange 3 so as to connect through the lower end of a cylindrical exhaust space 9 formed between the outer reaction tube 1 and the inner reaction tube 2. The reactive gas supply system 8 comprises a first reactive gas supply system 8a and a second reactive gas supply system 8b. The first reactive gas supply system 8a is designed to supply a first gas, which is, for instance, DCS, into the inside of the reaction tube 20, and the second reactive gas supply system 8b is designed to supply a second gas, which is, for instance, $NH_3$, into the inside of the reaction tube 20. Incidentally, it is also made possible to supply $N_2$ into the inside of the reaction tube 20 from the first reactive gas supply system 8a and the second reactive gas supply system 8b. Further, an $N_2$ gas supply system 16 is connected to the furnace port flange 3 so as to connect through the lower end of the cylindrical space 9.

The above-described furnace port flange 3, cap receiver 14, furnace port cap 5 are mostly made of metal such as stainless steel. A furnace port 40 including metal parts is structured mainly from these parts. A cap portion 30 is composed of the cap receiver 14 and the furnace cap 5. Incidentally, the surface of a stainless steel part on the inner peripheral surface of the furnace port flange 3 is called merely a flange portion 27, or the surface of the flange portion 27. Metal parts 41 of the furnace port is composed of the flange portion 27 and the above-described cap portion 30. Further, a reaction furnace 100 (called merely a furnace) is mainly composed of the reaction tube 20, the heater 11 to heat the inside of the reaction tube 20, and the furnace port flange 3 including the metal parts which support the reaction tube 20. In addition, gas supply system parts and piping are mainly composed of the reactive gas supply system 8 and the $N_2$ gas supply system 16.

Working steps for substrate processing, for instance, the steps for ordinary deposition using a vertical type CVD apparatus having the above-described structure are as follows. The boat 6 is let to go down with a boat elevator (not shown) via the furnace port cap 5 to charge many sheets of wafers 7 on the boat 6, and the boat 6 is let to go up with the boat elevator to insert into the furnace 100 for wafer loading. After the furnace port cap 5 closes up the opening 15 of the furnace port completely tight, while supplying a purge gas such as $N_2$ gas and the like into the reaction tube 20 from the gas supply system, the gas is exhausted from the exhaust system 10 to purge the inside of the furnace. Incidentally, as a gas supply system to supply the purge gas, the first reactive gas supply system 8a, or the second reactive gas supply system 8b is used, or a not-shown nozzle near the first reactive gas supply system 8a and the second reactive gas supply system 8b can be used.

Then, while supplying DCS and $NH_3$ which are reactive gases into the inside of the reaction chamber from the reactive gas supply system 8, the gases are exhausted from the exhaust system 10. At this time, the inside of the reaction tube 20 is kept at a predetermined pressure. The inside of the inner reaction tube 2 is heated to a predetermined temperature by applying power to the heater 11 to deposit a $Si_3N_4$ film on the surface of the wafer 7. After the deposition, an inert gas such as $N_2$ is introduced from the gas supply system, the inside of the reaction tube 20 is replaced with an inert gas to return to the atmospheric pressure. Then, the boat 6 is let to go down to unload the wafer 7 after completion of the deposition from the reaction tube 20.

The vertical type CVD apparatus is provided with a control apparatus 25 to control the present apparatus. The control apparatus 25 controls the heater 11, the N2 gas supply system 16, the reactive gas supply system 8, the boat elevator which is not shown, the rotator, and so on to control the above-described working steps for the above-described deposition and the like.

As described above, when deposition is performed on substrates using a brand new vertical type CVD apparatus, users are required to repeat the deposition 30 to 40 times until the amount of metal contamination generated from the furnace port 40 containing the metal parts comes to equal to or less than a permissible value, in a general method. On the contrary, in the present embodiment, reduction of the amount of the metal contamination is designed to promote by performing any one or all of the following three steps, before substrate processing by a user, in other words, before the repeat work of the deposition on actual substrates as final products. That is, an apparatus manufacturer supplies a user with a semiconductor device manufacturing apparatus after performing any one or all of the following three steps successively before the supply of the brand-new semiconductor device manufacturing apparatus to the user. Incidentally, the three steps may be performed by the user.

① Oxide Film Formation Step (Furnace Port Baking Step)

By baking the furnace port 40 in an oxidation gas atmosphere, an oxidation protective film which is an oxide film is allowed to grow on the surface of the metal parts 41 of the furnace port so that corrosion resistance of the metal parts 41 of the furnace port is improved.

② Cycle Purge Step

By performing a cycle purge, residual moisture of the gas supply system parts and the inside of the piping is removed so that a chemical reaction of $SiH_2Cl_2$ (DCS) gas which increases corrosiveness by reaction with moisture, and the metal parts is suppressed.

③ Coating Step $SiH_2Cl_2$ (DCS) gas is continuously supplied to the gas supply system so that a $SiO_2$ film is deposited on the surface of the metal parts 41 of the furnace port. A Fe-contained residue remaining in the inside of the gas supply system is discharged by changing thereof into chloride which is high in vapor pressure. Note that $NH_3$ gas is also supplied at this time.

It is most preferable to perform the above-described ① to ③ steps all successively. However, performing of even one step among these three steps still gives a metal contamination reduction effect. In that event, when the single step is repeated a plurality of times, it is desirable because the metal contamination reduction effect is more improved. Each step will be explained in detail as follows.

Figure 1:
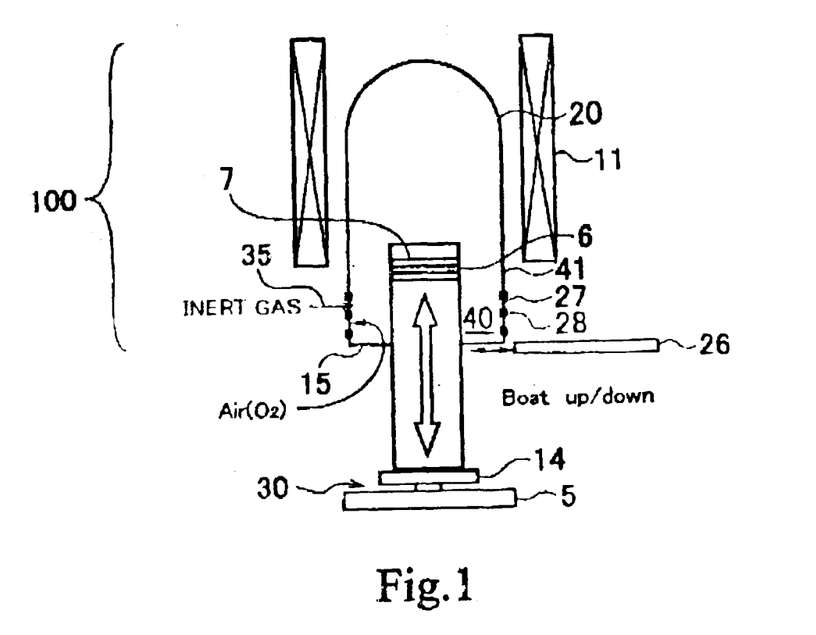
FIG. 1 is an explanatory view of a step of forming an oxide film (furnace port baking A) for a flange portion according to an embodiment.
Figure 2:
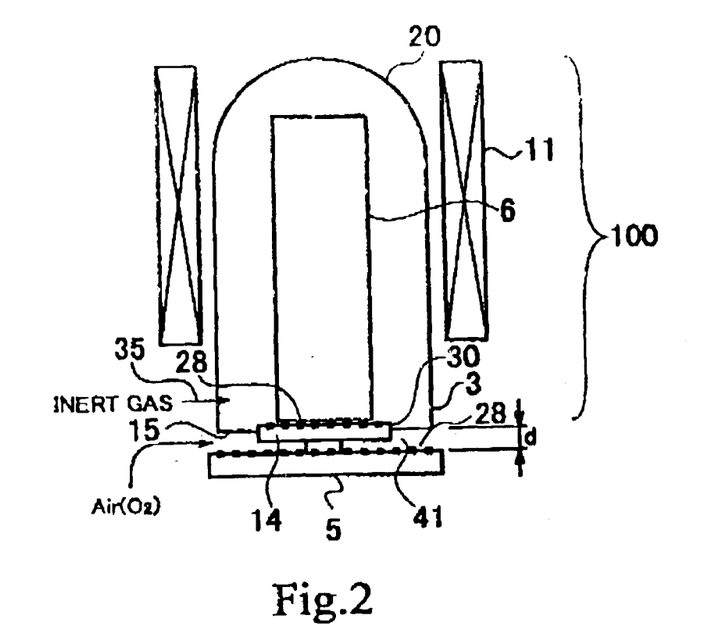
FIG. 2 is an explanatory view of a step of forming an oxide film (furnace port baking B) for a cap portion according to the embodiment.

[Furnace Port Baking] FIG. 1, FIG. 2

The furnace port baking is work to grow an oxide film on the surface of the furnace port metal port 41 by baking the furnace port 40 in an oxidation gas atmosphere before substrate processing. The furnace port baking comprises the following two of; baking A of the flange portion 27 in FIG. 1 (furnace port flange 3 in FIG. 4), and baking B of the cap portion 30 in FIG. 2. The furnace port baking is a process to perform these A and B successively.

In the embodiment, the baking is called for work to attach an oxide film forcibly on the surface of a stainless steel part in the furnace port 40 by oxygen in the atmosphere and heat of the reaction furnace.

The furnace port baking A is performed in a state of charging the wafers 7 on the boat 6. An object of charging the wafers 7 is to ensure heat capacity. If an empty boat 6 is moved up/down, since no wafer exists, the boat 6 easily gets cool when the boat 6 gets out from the furnace 100. This comes from shortage of radiant heat added to a stainless steel part of the lower portion of the furnace.

1. Furnace Port Baking A (FIG. 1)

The furnace port baking A is work to attach forcibly an oxide film 28 with oxygen ($O_2$) on the surface of the flange portion 27, which is a stainless steel part surface on the inner peripheral wall of the furnace port flange 3 by moving the boat 6 up/down. The oxide film 28 is attached on the surface of the flange portion 27 by the radiant heat from the wafers 7 which are charged in the boat 6 and heated, the radiant heat from the heater 11, and atmospheric oxygen ($O_2$) coming into the inside of the reaction furnace 100 at the time of boat down. FIG. 1 shows the boat during the up/down.

Plural sheets, for instance, the total of 11 sheets of the heat insulating boards 13 are put at intervals of one sheet on the boat cap 12 at the bottom portion of the boat (refer to FIG. 4). In addition, the boat 6 needs to charge dummy wafers for holding heat for the baking. For instance, five sheets of side dummies are put on the upper portion of the boat and ten sheets of the side dummies are put on the lower portion of the boat. The middle portion of the boat is filled with, for instance, 150 sheets of the dummy wafers. Note that no monitor wafer is put in. All of the wafers except the heat insulating boards 13 are expressed as wafers 7.

During the baking, the temperature in the furnace is set to be 700° C. with the heater 11. An inert gas to supply during the baking is $N_2$, and the flow amount of $N_2$ gas which is supplied into the furnace from a gas supply system 35 is a predetermined set value. Incidentally, the speed of up/down of the boat is, for instance, 80 mm/min.

(1) Stand-by

Initially, the boat 6 is at an up position and inserted in the reaction furnace 100.

(2) Boat Down

The boat 6 is allowed to go down by automatic operation of the control apparatus and taken out from the reaction furnace 100. A furnace port shutter 26 is closed to block the opening 15 of the furnace port.

(3) Wafer Charge

Wafers 7 are charged on the boat 6 from a cassette which is not shown. The reason to charge the wafers 7 on the boat 6 is to ensure heat capacity as described above. These wafers 7 are one of the heat sources at the time of oxidation.

(4) Wafer Load

The furnace port shutter 26 is opened and the boat 6 charged with wafers is made up and inserted into the reaction furnace 100 to load the wafers 7.

(5) Bake

The wafers 7 are heated in the reaction furnace. This is because the wafers 7 are served as a heat source.

(6) Wafer Unload

The boat 6 is allowed to go down and taken out from the reaction furnace 100, and the wafers 7 charged on the boat 6 are unloaded from the reaction furnace 100 under the atmospheric condition. During down of the boat 6, the flange portion 27 is oxidized by oxygen ($O_2$) in the atmosphere flowing into the furnace from the opening 15 of the furnace port, and the radiant heat from the wafers 7 which are mainly charged on the boat 6 and heated, and the oxide film 28 grows on the surface of the flange portion 27. When the boat 6 has come out completely from the reaction furnace 100, the furnace port shutter 26 is closed.

(7) Wafer Cooling

During cooling of the wafers, an oxide film is attached on the flange portion 27 in the reaction furnace. In a state of closing the furnace port shutter 26, the wafers 7 are cooled naturally at the down position of the boat. During cooling of the wafers, the surface of the flange portion 27 is oxidized by the heat in the reaction furnace 100, and oxygen ($O_2$) in the atmosphere flowing into the reaction furnace 100 at the time of boat down, and the oxide film 28 grows on the surface of the flange portion 27. After cooling, the furnace port shutter 26 is opened to prepare boat up.

(8) Wafer Load

The boat 6 is made up to load the wafers in the reaction furnace 100. At the time of loading the wafers, since the wafers 7 enter into the inside of the reaction furnace 100 in a cooled state, the radiant heat at this time cannot be expected, and though the atmosphere goes into the furnace, the flange portion 27 is not so oxidized due to shortage of heat.

(9) Bake

The wafers 7 are heated in the reaction furnace. This is because the wafers 7 are served as a heat source.

(10) Wafer Unload

The boat 6 is made down and taken out from the reaction furnace 100, and the wafers 7 charged on the boat 6 are unloaded from the reaction furnace 100 under the atmospheric condition. During down of the boat 6, the flange portion 27 is oxidized by oxygen ($O_2$) in the atmosphere flowing into the furnace from the opening 15 of the furnace port, and the radiant heat from the wafers 7 which are mainly charged on the boat 6 and heated, and the oxide film 28 attaches on the surface of the flange portion 27. When the boat 6 has come out completely from the reaction furnace 100, the furnace port shutter 26 is closed.

(11) Repeat

The above-described steps from (7) to (10) are repeated a plurality of times, for instance, 18 times. Since the up/down of the boat 6 is repeated a plurality of times, the oxide film 28 on the surface of the flange portion 27 grows further by heat and oxygen ($O_2$) in the atmosphere. The repetitious work of the oxide film growing step in a plurality of times is composed of this repeat work.

(12) Wafer Cooling

The wafers 7 are cooled naturally at the down position of the boat. During cooling of the wafers, the flange portion 27 is oxidized by the heat in the reaction furnace 100 and oxygen ($O_2$) in the atmosphere flowing into the reaction furnace 100 at the time of boat down, and the oxide film 28 is attached on the surface thereof.

(13) Wafer Discharge

The wafers 7 are discharged from the boat 6 to a cassette.

(14) Boat Up

The furnace port shutter 26 is opened, and the boat 6 is made up to insert the boat 6 into the furnace.

(15) End

Completion. The present baking takes about 48 hours.

Since the oxide film can be grown on the surface of the flange portion 27 before substrate processing, the flange portion 27 is covered with the oxide film so that reduction of the amount of metal contamination from the flange portion 27 can be promoted.

It should be noted that the step to attach the oxide film 28 on the surface of the flange portion 27 in the furnace port baking A is carried out only at the steps of wafer cooling in (7) and wafer unload in (10) ((6) is also included) as described above. At the time of the wafer cooling after the wafer unload, since the furnace port shutter 26 closes the opening 15 of the furnace port, the atmosphere flowing into the furnace can be thought to be almost zero. Accordingly, oxygen ($O_2$) used for the oxidation of the flange portion 27 at the time of the wafer cooling is oxygen ($O_2$) flowing into the furnace 100 during the unload. Generally, when the boat 6 is made down, the furnace port shutter 26 closes automatically, however, it is also possible to create a situation to stop the movement of the furnace port shutter 26 forcibly and not to block the opening 15 of the furnace port. However, if the opening 15 of the furnace port is not blocked, the heat in the furnace 100 is added to a discharge room (not shown) connecting through to the lower portion of the furnace, which undesirably gives unfavorable influence to various sensors and cables.

Incidentally, at the times of the wafer load in (4) and (8) described above, the oxide film is considered to attach in a very small amount, though not none. A main heat source in the furnace port baking A is considered to be radiant heat from the wafers 7 charged on the boat 6. It is supposed that since the wafers 7 got cold during the load, the radiant heat cannot be expected, and though the atmosphere gets mixed, oxide film is not attached due to shortage of heat.

2. Furnace Port Baking B (FIG. 2)

Furnace port baking B is work to attach an oxide film forcibly on the surface of the cap portion 30. The oxide film 28 is attached on the surface of the cap receiver 14 and the furnace port cap 5 which compose the cap portion 30 by direct radiant heat from the heater 11 of the furnace 100 and oxygen $O_2$ in the atmosphere flowing in from a gap between the furnace port cap 5 and the furnace port flange 3.

The processing steps of the furnace port baking B is as follows. Total 11 sheets of the heat-insulating boards 13 are put at intervals of, for instance, one sheet on the boat cap 12 at the bottom portion of the boat, but the wafers are not charged on the boat 6 (refer to FIG. 4). During baking, the temperature in the furnace is kept to 700° C. $N_2$ is used as the gas, and a predetermined amount of $N_2$ is supplied.

(1) Stand-by

Initially, the boat 6 is at an up position and inserted into the inside of the reaction furnace 100.

(2) Semi-down

The boat 6 is made down with a manual operation so that the furnace port cap 5 goes downward from the position of the opening 15 of the furnace port by 20 mm. Through this step, a gap to allow oxygen ($O_2$) in the atmosphere to enter into the furnace is created.

(3) Bake

In a state of maintaining the gap d as it is, it is kept for 14 hours. The cap portion 30 is baked with the heat of the furnace 100. Here, while the heat source of the above-described furnace port baking A is radiant heat from the wafers 7 charged on the boat 6, the heat source of the furnace port baking B is direct radiant heat from the heater 11 of the furnace 100. The oxide films 28 are formed on the respective surfaces of the cap receiver 14 and the furnace port cap 5 which compose the cap portion 30 by the radiant heat and oxygen ($O_2$) in the atmosphere coming into the furnace.

(4) End

Completion. The present baking takes about 14 hours.

Since the oxide film can be grown on the surface of the cap portion 30 before substrate processing, the cap portion 30 is covered with the oxide film so that reduction of the amount of metal contamination from the cap portion 30 can be promoted.

Besides, in the furnace port baking B, the wafers are not required to be charged as in the case of the furnace port baking A. The reason is that the heat source of the furnace port baking B is direct radiant heat from the heater 11 of the furnace 100, and when the wafers are charged, the radiant heat is blocked. However, if even the heat insulating board 11 is taken out, the O-rings 4 (refer to FIG. 4) of the furnace port 40 cannot withstand heat. Therefore, it is preferable to let the heat insulating board 11 in.

Since the oxidation protective film grows on the surface of the metal parts 41 of the furnace port by the above-described furnace port baking A and B, corrosion resistance is improved.

[Cycle Purge] FIG. 4

Cycle purge is work to remove moisture by repeatedly purging inside the reaction furnace by supplying an inert gas such as $N_2$ and the like. The steps of the cycle purge are as follows. Total 11 sheets of the heat-insulating boards 13 are put at intervals of, for instance, one sheet on the boat cap 12 at the bottom portion of the boat, but the wafers are not charged on the boat. During the cycle purge, a furnace temperature is set to, for instance, 680° C. The flow amount of the gas is appropriately set.

(1) Stand-by

It is initialized. The inside of the furnace is kept at the atmospheric pressure.

(2) Slow Evacuation

Vacuum slow evacuation is performed through the exhaust system 10 in a state of suspending supply of $N_2$ gas completely from the gas supply system, so that the inside of the furnace is evacuated gradually.

(3) Main Evacuation

Vacuum main evacuation is performed through the exhaust system 10 in a state of suspending supply of $N_2$ gas completely from the gas supply system, so that moisture is discharged by evacuating the inside of the furnace.

(4) $N_2$ Purge 1

While $N_2$ gas is supplied in a very small quantity, the reaction furnace is evacuated. Moisture discharge is promoted by supplying $N_2$ gas into a vacuum atmosphere.

(5) Vacuum Evacuation

While $N_2$ gas is allowed to flow in a very small quantity, the reaction furnace is evacuated. Moisture discharge is promoted by supplying $N_2$ into a vacuum atmosphere.

(6) $N_2$ Purge 2

While $N_2$ gas is supplied in a small quantity, the reaction furnace is evacuated. At this time, moisture discharge is promoted by giving pulsatory motion to the flow amount of $N_2$.

(7) Repeat

The above-described steps in (5) and (6) are repeated a plurality of times, for instance, 19 times.

(8) Vacuum Evacuation

While $N_2$ gas is supplied in a very small quantity, the reaction furnace is evacuated. Moisture discharge is promoted by supplying $N_2$ into a vacuum atmosphere.

(9) Vent

Vacuum evacuation is performed in a state of suspending supply of $N_2$ gas completely, and the next step is prepared.

(10) Leak

It is a first half stage of vacuum destruction. The inside of the furnace is returned to the atmospheric pressure by adding a small amount of $N_2$ gas.

(11) Main Leak

It is a latter half stage of the vacuum destruction. The inside of the furnace is returned to the atmospheric pressure by increasing the amount of N2 gas supply.

(12) End

It is a completed state. The inside of the furnace is at the atmospheric pressure. It takes about 9 hours to perform $N_2$ cycle purge.

By the above-described cycle purge, remaining moisture on the parts of the gas supply system 35 and inside of the piping is removed, and a chemical reaction between DCS gas which increases corrosiveness by reacting with moisture and the metal parts 41 of the furnace port is suppressed.

Figure 3:
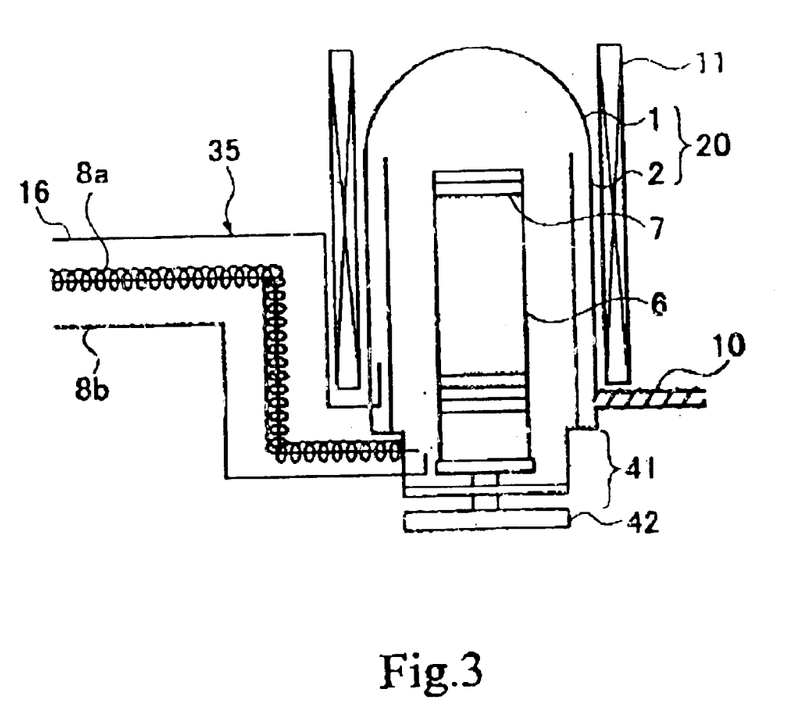
FIG. 3 is an explanatory view of coating according to an embodiment.

[Coating] FIG. 3

Coating is work to coat with a film on the surface of quartz part such as a reaction tube and the like as well as the metal parts 41 of the furnace port by supplying the deposition gas to be used for substrate processing while heating inside the reaction furnace with the heater 11 in a state of charging substrates which will not be final products on the boat 6, in the reaction furnace before the substrate processing. Concretely, by supplying DCS (dichlorosilane) and $NH_3$ which are deposition gas into the inside of the furnace from the gas supply systems 8a and 8b to purge the inside of the furnace. The temperature inside the furnace at the time of the coating is 730° C. which is the same deposition temperature as that at the time of ordinary deposition, though the set values somewhat differ according to the zone of the reaction furnace 100. Note that the numeral 42 is a rotator to rotate the boat 6. The gas supply system 35 comprises the first reactive gas supply system 8a, the second reactive gas supply system 8b, and the $N_2$ gas supply system 16. In addition, $N_2$ gas also can be supplied from the first reactive gas supply system 8a and the second reactive gas supply system 8b as described above.

The coating is performed by charging the wafers 7 on the boat 6. That is, a plurality of heat insulation boards 13, for instance, total of 11 sheets are put at intervals of one sheet on the boat cap 12 at the bottom portion of the boat (refer to FIG. 4). Five sheets of the side dummies are put on the upper portion of the boat and ten sheets of the side dummies are put on the lower portion of the boat. The middle portion of the boat is full charged with, for instance, 150 sheets of the dummy wafers. Note that no monitor wafer is put in.

The reason to full charge with the wafers 7 at the time of coating is to control the film thickness accumulated on the quartz part such as the reaction tube 20 and the like. If the wafers are not charged, since the surface area to come into contact with gas in the furnace becomes insufficient, a film having thickness equal to or larger than that at the time of ordinary deposition is created on the quartz part such as the outer reaction tube 1 or the inner reaction tube 2. If the thickness of the accumulated film is failed to be controlled, it causes a fear of occurring particles due to film peeling off, apart from the metal contamination problem. In order to prevent the occurrence of the particles, the wafers 7 are full charged. Further, as for 150 sheets of wafers, the accumulated film thickness of the wafers 7 is preferably zero, and fill dummy wafers are sufficient. The reason of the accumulated film thickness to be zero here is because it is supposed that the wafers will be replaced many times during the step with fear of the film peeling off after the coating.

The steps of the coating are as follows. Here, as an example of repeating the coating step to coat with a film on the surface of the metal parts, an ordinary recipe at the time of the deposition is repeated twice.

(1) Stand-by

Initially, the boat 6 is at an up position and inserted in the reaction furnace 100 in a state of the wafers 7 being full charged.

(2) Starting of a first Coating Recipe (3) DCS gas and $NH_3$ gas are supplied from the DCS gas supply system 8a and $NH_3$ gas supply system 8b respectively into the reaction chamber 20 to coat with a $SiO_2$ film on the surface of the metal parts 41 of the furnace port. The $SiO_2$ film is formed by a reaction of oxygen containing substance such as $H_2O$ coming into the furnace with $SiH_2Cl_2$. In addition, a remaining Fe component is changed into chloride by purging of DCS gas supply system 8a with DCS gas and $NH_3$ gas supply system 8b with $NH_3$ gas to discharge the chloride from the reaction furnace 100 through the exhaust system 10. The flow amount of DCS gas is made more than that at the time of ordinary deposition and the time to supply the gas is made longer. Further, as for NH3 gas, the flow amount is made more and the time to supply NH₃ gas is made longer. When the amount of gas at the time of supplying the gas to be used for substrate processing is made more, and the time to supply the gas is made longer than the time for substrate processing, it is possible not only to deposit rapidly the film with required thickness on the surface of the metal parts, but also to discharge the metal contaminant in the reaction furnace more effectively.

(4) Completion of the First Coating Recipe (5) Wafer Replacement

When performing a second coating recipe, new wafers, namely, wafers 7 on which no film is deposited are charged on the boat 6. The reason to replace the wafers 7 is to prevent peeling off of the film.

(6) Starting of the Second Coating Recipe (7) DCS gas and NH₃ gas are supplied from the DCS gas supply system 8a and NH₃ gas supply system 8b respectively into the inside of the reaction chamber 20 to coat the surface of the metal parts 41 of the furnace port with the SiO₂ film. A remaining Fe component is changed into chloride by purging of the gas supply system 35 with DCS gas and NH₃ gas to discharge the chloride. For this purpose, the flow amount of the gas is made more than that at the ordinary time, and the time to supply the gas is also made longer. Besides, it is preferable to adjust the pressure to an optimal value for changing into the chloride.

(8) Completion of the Second Coating Recipe

Then, two repeated times of the coating steps to coat with the film on the surface of the metal parts are completed.

(9) Discharge of the Wafers from the Boat (wafer Discharge)

(10) Starting of a Special Recipe

The special recipe means a kind of a cycle purge. The boat 6 is made up without wafers. A cycle purge is performed by supplying N2 gas from the gas supply system to remove remaining particles and moisture in the furnace.

(11) waiting until the temperature in the reaction furnace is stabilized.

(12) Vacuum slow evacuation is performed for the reaction furnace 100 through the exhaust system 10 in a state of suspending supply of N₂ gas completely from the gas supply system 35, so that the inside of the furnace is evacuated gradually.

(13) Vacuum main evacuation is performed for the reaction furnace 100 through the exhaust system 10 in a state of suspending supply of N₂ gas completely from the gas supply system 35, so that the inside of the furnace is evacuated.

(14) While N₂ gas is supplied in a very small quantity from the gas supply system 35, the inside of the furnace is evacuated to a vacuum through the exhaust system 10.

(15) The inside of the furnace is evacuated to a vacuum through the exhaust system 10 in a state of suspending supply of N₂ gas completely supplied from the gas supply system 35.

(16) Repeat

The steps in (14) and (15) are repeated.

(17) The temperature inside the furnace is somewhat lowered (730° C. to 600° C.) forcibly, and a low temperature purge is performed to cause peeling off of the film intentionally to generate particles. The temperature inside the furnace at this time is set to 600° C. over the whole zone. The setting temperature is set by a temperature controller in the control apparatus 25 (refer to FIG. 4) and the temperature is lowered by natural cooling through lowering of the power.

(18) N₂ gas supply is completely suspended to evacuate to a vacuum.

(19) While supplying a very small quantity of N₂ gas, evacuation to a vacuum is performed.

(20) N₂ gas supply is completely suspended to evacuate to a vacuum.

(21) Repeat

The steps in (19) and (20) are repeated.

(22) Vacuum destruction of the furnace is prepared.

(23) The vacuum destruction of the furnace is performed.

(24) The vacuum destruction of the furnace is completed and the inside of the furnace is returned to the atmospheric pressure.

(25) The specific recipe is finished to complete the coating. The time of the evaluation is about 16 hours.

Thus, in the coating steps, when the deposition gas is repeatedly supplied into the inside of the furnace, DCS (SiH₂Cl₂) which is a deposition gas and an oxide containing substance such as H₂O and the like which comes into the reaction furnace at the time of wafer load/wafer unload and so on and attaches on the surface of the metal parts 41 of the furnace port to remain inside the reaction furnace, react with each other, and the SiO₂ film is deposited on the surface of the furnace port metal parts 41. Further, DCS and NH₃ are continued to supply to the gas supply system 35, and a residue containing Fe remaining inside the gas supply system 35 and the reaction furnace is changed into chloride which is high in vapor pressure so that the chloride is discharged. Besides, since the deposition gas used for wafer processing is supplied to the inside of the reaction furnace, the gas supply system for the coating and the gas supply system for substrate processing can be used in common as the gas supply system 35.

Figure 5:
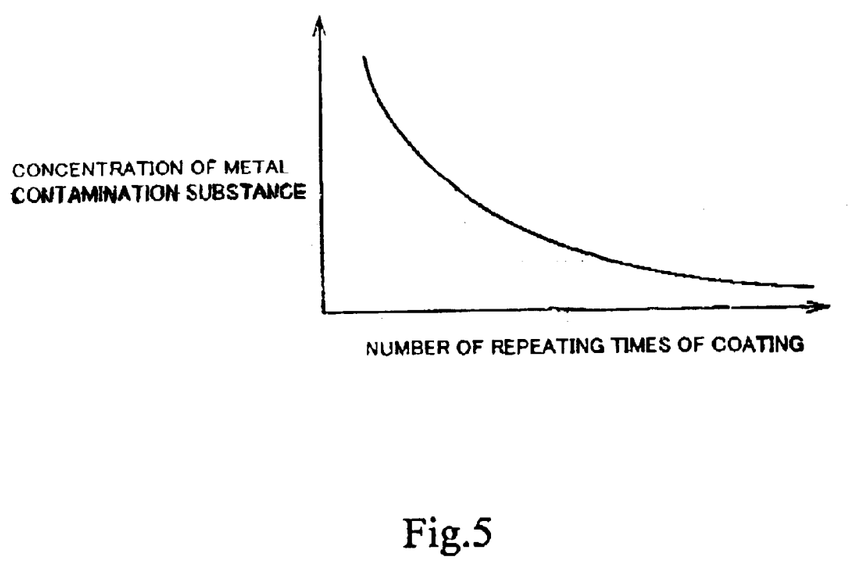
FIG. 5 is a characteristic chart of metal contaminant concentration against the number of times of repeating the coating according to the embodiment.

It is preferable to repeat the coating steps to coat with the film on the surface of the metal parts a plurality of times. The coating is preferably repeated a plurality of times, for instance, twice to several ten times. It becomes clear from an experiment made by inventors that as the number of times to repeat the coating steps is increased, a metal contamination level in the inside of the furnace decreases as shown in FIG. 5. When the coating steps are repeated 30 to 40 times in the experiment, the metal contamination level has reached a level which presents no problem (no influence on the device). Incidentally, a total film thickness of SiO₂ to be coated on the surface of the metal parts is preferably 250 to 350 Å, and, for instance, about 300 Å is cited as an example.

According to the above-described embodiment to perform three steps sequentially as described above, the following excellent effect can be exhibited.

(1) The time to decrease the amount of metal contamination can be reduced, and the period from delivery of the apparatus till a user who receives the apparatus can start production can be shortened. Accordingly, the initial availability is drastically improved. In the present embodiment, 62 hours of the baking (48 hours plus 14 hours), 9 hours of the cycle purge, and 16 hours of the coating, that is, only a total of 87 hours is required. On the contrary, a method usually performed in the prior art requires as long as 504 to 672 hours. Thus, the time till the amount of metal contamination is decreased can be reduced to ⅙ to ⅛ compared with an ordinary method.

(2) Further, according to the embodiment, since the initial metal contamination can be reduced effectively by performing the baking, the cycle purge, and the coating, the steps are easier compared with performing the deposition repeatedly as in the ordinary method. Especially, performing of baking before coating can improve the metal contamination effect.

(3) Since the contamination level is stabilized after the amount of the metal contamination comes to a permissible value or less, yield of the semiconductor device can be improved.

(4) Further, even when the $Si_3N_4$ film is deposited on the wafer by supplying DCS and $NH_3$ gas using a brand-new semiconductor manufacturing apparatus which has finished all of the metal contamination processing steps based on the embodiment, since the amount of Fe contamination on the wafers does not exceed the permissible value, the yield of the semiconductor device which is produced from the wafer is remarkably improved.

It should be noted that in the coating steps according to the above-described embodiment, at the first and second times of the deposition, though the coating is carried out in a state of charging substrates which will not be final products on the boat, the present invention is not limited to this. For instance, it is acceptable to perform coating by inserting only a boat which charges no substrate into the reaction furnace or, further, to perform coating in a state to insert no substrate nor boat into the reaction furnace. Because, as far as the metal contamination level, with increase of the number of the repetition times of the coating steps, the metal contamination level can be reduced, irrespective of loading or no loading of the substrates.

Besides, though a $SiO_2$ film is grown on the surface of the metal parts while supplying $SiH_2Cl_2$ (DCS) and $NH_3$ in the coating steps, it is sufficient even to supply at least only DCS. Because an oxide film can be grown on the surface of the metal parts by oxidizing the surface of the metal parts even by supplying DCS.

It should be noted that though the case to perform the cycle purge in the inside of the reaction furnace after the oxide film growing (baking) and before the coating, is described in the above-described embodiment, it is acceptable to perform the cycle purge in the inside of the reaction furnace after the coating.

Further, in the embodiment, though the most preferable case of combining three steps of the oxide film growing (baking), the cycle purge, and the coating is described, it is acceptable to perform only the coating step to prevent the metal contamination. It has been cleared from the experiment made by inventors that reduction effect of the metal contamination is more in the case of depositing the $SiO_2$ film on the surface of the metal parts by the coating step than merely oxidizing the surface of the metal parts by the oxide film growing step, that is, growing the oxide film on the surface of the metal parts. It is also confirmed that the effect of preventing the metal contamination is improved when the coating step is performed after oxidizing the surface of the metal parts by the oxide film growing step compared with the case of performing only the coating step.

According to the present invention, metal contamination from the furnace port including the metal parts can be easily reduced in a short time. Besides, according to the present invention, a metal contamination level from the furnace port including the metal parts can be sufficiently reduced.

What is claimed is:

1. A method for manufacturing a semiconductor device, comprising the steps of:
    coating with a film on the surface of metal parts of a furnace port of a reaction furnace comprising a reaction tube, a heater to heat the inside of the reaction tube, and the furnace port located below the heater and including the metal parts which support the reaction tube by supplying gas to be used for substrate processing into the reaction furnace, before the substrate processing;
    loading substrates charged on a boat into the reaction; and
    processing the substrates charged on the boat in the reaction furnace by supplying gas used for said substrate processing into the reaction furnace,
    wherein the coating step is performed a plurality of times.

2. The method for manufacturing the semiconductor device according to claim 1,
    wherein a silicon nitride film is formed on the substrates by a CVD method using $SiH_2Cl_2$ and $NH_3$ in said substrate processing step; and
    wherein at least $SiH_2Cl_2$ is supplied into the reaction furnace in the coating step.

3. The method for manufacturing the semiconductor device according to claim 2, wherein the film to coat on the surface of the metal parts is a $SiO_2$ film.

4. The method for manufacturing the semiconductor device according to claim 3, wherein said $SiO_2$ film is formed by reaction of oxygen containing substance such as $H_2O$ coming into the furnace with $SiH_2Cl_2$ supplied into the reaction furnace.

5. The method for manufacturing the semiconductor device according to claim 1, wherein said coating step comprises the steps of:
    loading substrates charged on the boat which will not be final products, into the reaction furnace;
    supplying gas used for the substrate processing into the reaction furnace while heating the substrates charged on the boat in the reaction furnace; and
    unloading the substrates charged on the boat from the reaction furnace.

6. The method for manufacturing the semiconductor device according to claim 1, wherein the amount of the gas supplied in said coating step is designed to be more than the amount of the gas supplied in the substrate processing step.

7. The method for manufacturing the semiconductor device according to claim 1, wherein the time to keep supplying the gas in said coating step is made longer than the time to keep supplying the gas in the substrate processing step.

8. The method for manufacturing the semiconductor device according to claim 1, wherein every time when said coating step is repeated, the substrates are replaced to other new substrates which will not be final products.

9. A method for manufacturing a semiconductor device, comprising the steps of:
    coating with a $SiO_2$ film on the surface of metal parts of a furnace port of a reaction furnace comprising a reaction tube, a heater to heat the inside of the reaction tube, and the furnace port located below the heater and including the metal parts which support the reaction tube by supplying at least $SiH_2Cl_2$ which is a deposition gas into the reaction furnace, before deposition so as to react with oxide containing substance coming into the furnace;
    loading substrates charged on a boat into the reaction furnace; and
    depositing a silicon nitride film on the substrates charged on the boat in the reaction furnace by supplying $SiH_2Cl_2$ and $NH_3$ as the deposition gas into the reaction furnace.

10. A method for manufacturing a semiconductor device, comprising the steps of:
    growing an oxide film on the surface of metal parts of a furnace port of a reaction furnace comprising a reaction tube, a heater to heat the inside of the reaction tube, and the furnace port located below the heater and including the metal parts which support the reaction tube, before the substrate processing;
    loading the substrates charged on a boat into the reaction furnace; and processing the substrates charged on the boat in the reaction furnace, wherein said step of growing the oxide film comprising the steps of loading the substrates charged on the boat, which will not be final products, into the reaction furnace;

heating the substrates charged on the boat in the reaction furnace; and unloading the substrates charged on the boat from the reaction furnace under the atmospheric condition.

11. The method for manufacturing the semiconductor device according to claim 10, wherein said oxide film growing step is repeated a plurality of times before the substrate processing step.

12. The method for manufacturing the semiconductor device according to claim 10, wherein said oxide film growing step is performed while supplying an inert gas from a gas supply system into the reaction furnace.

13. A method for manufacturing a semiconductor device, comprising the steps of:

growing an oxide film on the surface of metal parts of a furnace port of a reaction furnace comprising a reaction tube, a heater to heat the inside of the reaction tube, and the furnace port located below the heater and including the metal parts which support the reaction tube, before the substrate processing;

loading the substrates charged on a boat into the reaction furnace; and processing the substrates charged on the boat in the reaction furnace, wherein said step of growing the oxide film comprising the steps of inserting the boat without charging substrates thereon into the reaction furnace;

maintaining a furnace port cap which supports the boat and blocks an opening of the furnace port apart from the opening of the furnace port; and heating the inside of the reaction furnace in a state of keeping the furnace port cap apart from the opening of the furnace port.

14. The method for manufacturing the semiconductor device according to claim 13, wherein the furnace port cap is kept apart from the opening of the furnace port by about 20 mm or less.

15. The method for manufacturing the semiconductor device according to claim 13, wherein the step of growing the oxide film is performed while supplying an inert gas from a gas supply system into the reaction furnace.

* * * * *